(12) United States Patent
Oh

(10) Patent No.: US 6,909,660 B2
(45) Date of Patent: Jun. 21, 2005

(54) RANDOM ACCESS MEMORY HAVING DRIVER FOR REDUCED LEAKAGE CURRENT

(75) Inventor: Jong-Hoon Oh, Chapel Hill, NC (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/672,118

(22) Filed: Sep. 26, 2003

(65) Prior Publication Data

US 2005/0068836 A1 Mar. 31, 2005

(51) Int. Cl.[7] ................................................. G11C 7/00
(52) U.S. Cl. .................. 365/229; 365/230.06; 365/222
(58) Field of Search ............................ 365/229, 230.06, 365/222

(56) References Cited

U.S. PATENT DOCUMENTS

| | | | |
|---|---|---|---|
| 4,800,332 A | 1/1989 | Hutchins | |
| 5,914,905 A | * 6/1999 | Hikichi et al. | ............... 365/229 |
| 6,055,206 A | 4/2000 | Tanizaki et al. | |
| 6,236,617 B1 | 5/2001 | Hsu et al. | |
| 6,269,046 B1 | 7/2001 | Lee et al. | |
| 6,307,805 B1 | 10/2001 | Andersen et al. | |
| 6,781,915 B2 | * 8/2004 | Arimoto et al. | ........ 365/230.06 |

* cited by examiner

*Primary Examiner*—Huan Hoang
(74) *Attorney, Agent, or Firm*—Dicke, Billig & Czaja, PLLC

(57) ABSTRACT

One embodiment of the present invention provides a random access memory (RAM) including an array of memory cells arrange in a plurality of rows and columns, wherein access of each row is based on a wordline signal, and a wordline circuit. The wordline circuit includes a voltage node receiving a positive voltage from an external power source, a decoding node receiving a decoding signal having a state representative of an idle mode, and a driver circuit providing to at least one of the rows of memory cells a wordline signal based on the decoding signal and forming a current leakage path from the voltage node to a reference node when the decoding signal state indicates the idle mode.

28 Claims, 4 Drawing Sheets

US 6,909,660 B2

RANDOM ACCESS MEMORY HAVING DRIVER FOR REDUCED LEAKAGE CURRENT

BACKGROUND

Decreased power consumption of dynamic random access memory (DRAM) devices during a standby, or self-refresh mode of operation is becoming increasingly important because of their ever-growing use in mobile applications. One technique to decrease power consumption is to reduce the refresh current supplied to individual memory cells of the device. Another approach is to minimize charge pump related leakage currents typically existing in row decoder circuits of conventional DRAM memory devices.

DRAM memory devices generally employ a row decoder circuit comprising a decoding unit and a wordline driver to drive a voltage level of a wordline high or low in order to "open" or "close" access to an associated row of memory cells. Typically, such circuits operate to drive the wordline voltage level between a range of a positive voltage ($V_{PP}$), which is greater than a maximum available power supply voltage ($V_{CC}$), and a negative voltage ($V_{NEG}$), which is less than a reference voltage ($V_{SS}$), such as a ground reference. By utilizing $V_{NEG}$ rather than $V_{SS}$, the threshold level of data cell access transistors can be reduced, resulting in reduced stress on the access transistors and enabling a reduction in the $V_{PP}$ level.

Typically, based on row address signals and a precharge signal, the wordline driver drives an associated wordline at $V_{PP}$ ("high") to open a row of memory cells to enable read/write access to the memory cells, and at $V_{NEG}$ ("low") to close a row of memory cells. During periods of read/write inactivity, the wordline driver operates in an idle mode, sometimes referred to as a retention or self-refresh mode, and closes the row of memory cells by maintaining the wordline at $V_{NEG}$ when the associated row is not selected to be refreshed.

FIG. 1 is a schematic diagram depicting one example of a conventional row decoder circuit 30. Row decoder circuit 30 comprises a decoding unit 32 and a wordline driver circuit 34. Row decoder circuit 32 includes a PMOS transistor 36 and a cascade of NMOS transistors 38, 40, and 42. PMOS transistor 36 receives a bar precharge signal (bPRCH) at gate, has a drain coupled to a decoding node 44, and has a source. The drain of NMOS transistor 38 is coupled to decoding node 44 and the source is coupled to the drain of NMOS transistor 40. The drain NMOS transistor 42 is coupled to the source of NMOS transistor 40 and the source is coupled to ground. The gates of NMOS transistors 38, 40, and 42 respectively receive address inputs XA23, XA45, and XA678. Address inputs XA23, XA45, and XA678 represent address lines two through eight of a memory bus of an associated memory device, such as a DRAM memory device, in precoded form.

Wordline driver 34 includes PMOS transistors 46, 48, 50, and 52, NMOS transistors 54, 56, and 58, a positive voltage node 60, a negative voltage node 62, a bar decode node (bdec) 64, and an output node 66. Wordline driver 34 receives positive voltage $V_{PP}$ at positive voltage node 60 and negative voltage $V_{NEG}$ at negative voltage node 62, and provides a bar wordline signal (bMWL) to a corresponding row of an associated memory array at output node 66.

During standby, or self-refresh mode, which comprises a large portion of semiconductor memory device operating time, bPRCH is held "low", causing PMOS transistor 36 to turn on and node dec 44 to be set at $V_{PP}$. With node dec 44 at $V_{PP}$, PMOS transistor 50 is turned off and PMOS transistor 48 is turned on, thereby setting the gate of NMOS transistor 56 at $V_{PP}$. With its gate set at $V_{PP}$, NMOS transistor 56 is turned on, thereby setting node ndec 64 to at $V_{NEG}$. With node bdec 64 at $V_{NEG}$, NMOS transistor 58 is turned off and PMOS transistor 52 is turned on, thereby setting output node 66, an thus bMWL, to $V_{PP}$. With bMWL set at $V_{PP}$, the corresponding memory array row is held closed.

With node bdec 64 set at $V_{NEG}$, PMOS transistor 46 is also turned on. PMOS transistor 46 thereby functions as a latch to hold node dec 44 at $V_{PP}$ during self-refresh mode when bPRCH is set "high" but the corresponding memory array row is not selected for refresh.

While row decoder circuit 30 functions to hold the corresponding memory array row closed during self-refresh mode, except when the corresponding row is selected for refresh, wordline driver 34 forms a current leakage path from positive voltage node 60 to negative voltage node 62 via PMOS transistor 50 and NMOS transistor 56. Typically, $V_{PP}$ is provided by a positive charge pump and $V_{NEG}$ is provided by a negative charge pump, which are coupled to the wordline driver. Thus, during self-refresh mode, a leakage current flows from the positive charge pump coupled at positive voltage node 60 to the negative charge pump coupled at negative voltage node 62.

FIG. 2 is a block diagram 80 illustrating generally a leakage current path 82 from a positive charge pump 84 to a negative charge pump 86 formed by wordline driver 30 during idle mode. Lines 87 and 88 respectively represent a $V_{PP}$ supply rail and a $V_{NEG}$ supply rail within a corresponding semiconductor memory device, such as a DRAM memory device. Leakage path 82 is coupled between VPP supply rail 87 and VNEG supply rail 88 via positive voltage node 60 and negative voltage node 62. A leakage current ($I_{LEAK}$) 89 flows from positive voltage node 60 into negative voltage node 62.

$I_{LEAK}$ 89 flowing out of node 60 and into node 62 causes $V_{PP}$ to drop and $V_{NEG}$ to rise, thereby causing both positive charge pump 84 and negative charge pump 86 to consume power to maintain $V_{PP}$ and $V_{NEG}$ at desired levels. Typically, charge pumps have low efficiencies, often in the range of 40–50%, and thus consume more than just the power lost via $I_{LEAK}$ in maintaining their output voltages at desired levels. For example, a charge pump having an efficiency of 50% will consume $2*I_{LEAK}$ of power in maintaining its output voltage at the desired level.

Semiconductor memory devices, particularly DRAM memory devices, would benefit from a more efficient wordline driver.

SUMMARY

One embodiment of the present invention provides a random access memory (RAM) including an array of memory cells arrange in a plurality of rows and columns, wherein access of each row is based on a wordline signal, and a wordline circuit. The wordline circuit includes a voltage node receiving a positive voltage from an external power source, a decoding node receiving a decoding signal having a state representative of an idle mode, and a driver circuit providing to at least one of the rows of memory cells a wordline signal based on the decoding signal and forming a current leakage path from the voltage node to a reference node when the decoding signal state indicates the idle mode.

DETAILED DESCRIPTION

In the following Detailed Description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
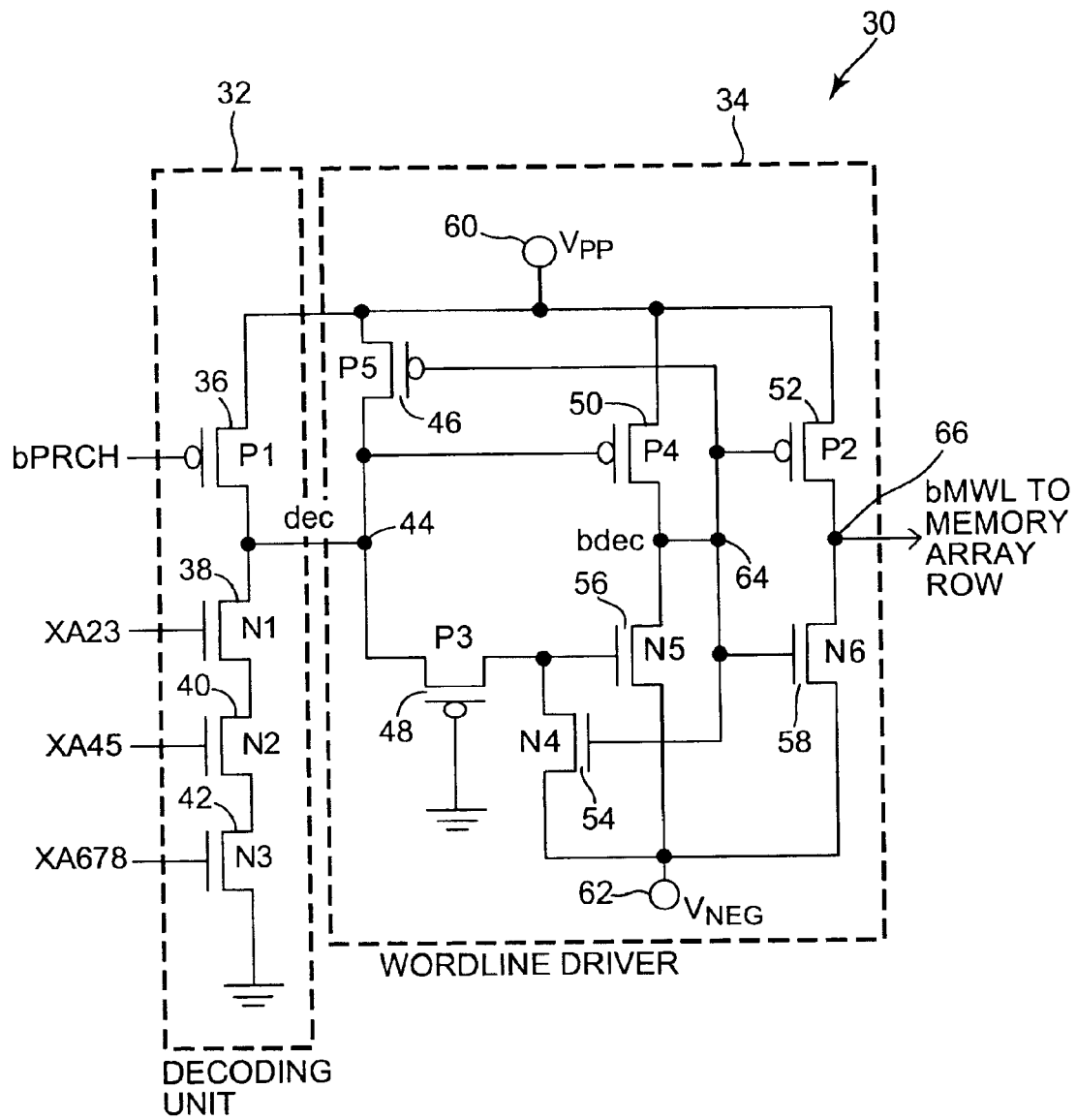
FIG. 1 is a schematic block diagram illustrating one example of a row decoder circuit.
Figure 2:
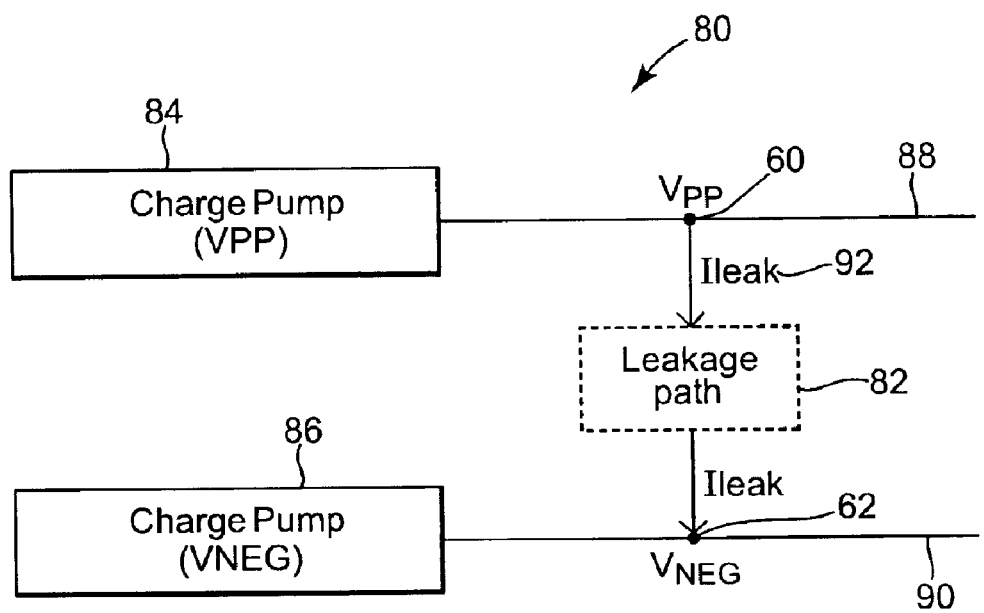
FIG. 2 is a block diagram illustrating generally a leakage path formed by the row decoder circuit of FIG. 1.
Figure 3:
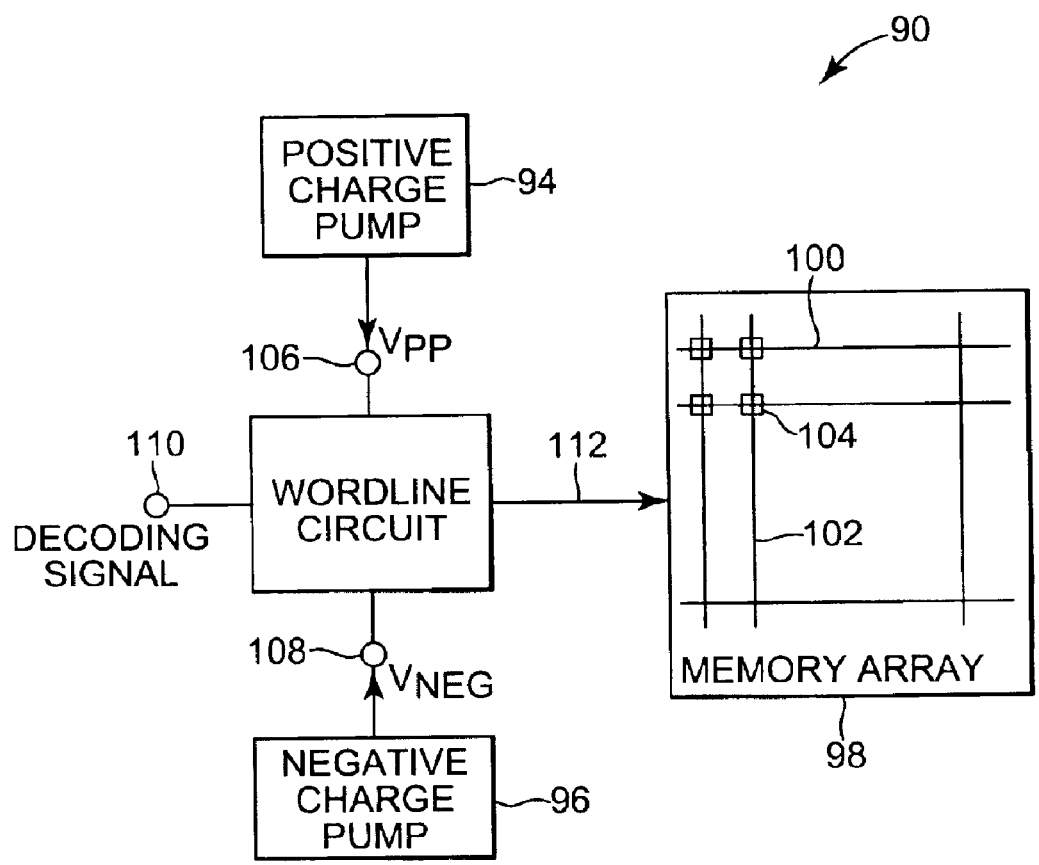
FIG. 3 is a schematic block diagram illustrating one exemplary embodiment of a DRAM device according to the present invention.

FIG. 3 is a block diagram illustrating generally one exemplary embodiment of a DRAM device 90 according to the present invention employing a wordline circuit 92 for reducing leakage current during a self-refresh mode of operation. By reducing the leakage current, the power consumption of DRAM device 90 is reduced. DRAM device 90 further includes a positive voltage pump 94, a negative voltage pump 96, and a memory array 98. Conductive wordlines 100, sometimes referred to as row select lines, extend in the x-direction across memory array 98, while conductive bit lines 102, sometimes referred to as column select lines, extend in the y-direction. A memory cell 104 is located at each intersection of a wordline 100 and bit line 102.

Wordline circuit 92 further includes a positive voltage node 106 coupled to and receiving a positive voltage ($V_{PP}$) from positive charge pump 94, a negative voltage node 108 coupled to and receiving a negative voltage ($V_{NEG}$) from negative charge pump 96, and a decoding node (dec) 10 receiving a decoding signal representative of the self-refresh mode.

Wordline circuit 92 is configured to provide a wordline signal 112 to a corresponding row(s) 100 of memory cells of memory array 98 based on the decoding signal, and to form a current leakage path from positive voltage node 106 to ground when the decoding signal indicates the associated semiconductor memory devices is in the self-refresh mode. By wordline circuit 92 forming a leakage path from positive voltage node 106 to ground, leakage current from positive charge pump 94 does not adversely affect negative charge pump 96, resulting in DRAM device consuming less energy during self-refresh mode.

Figure 4:
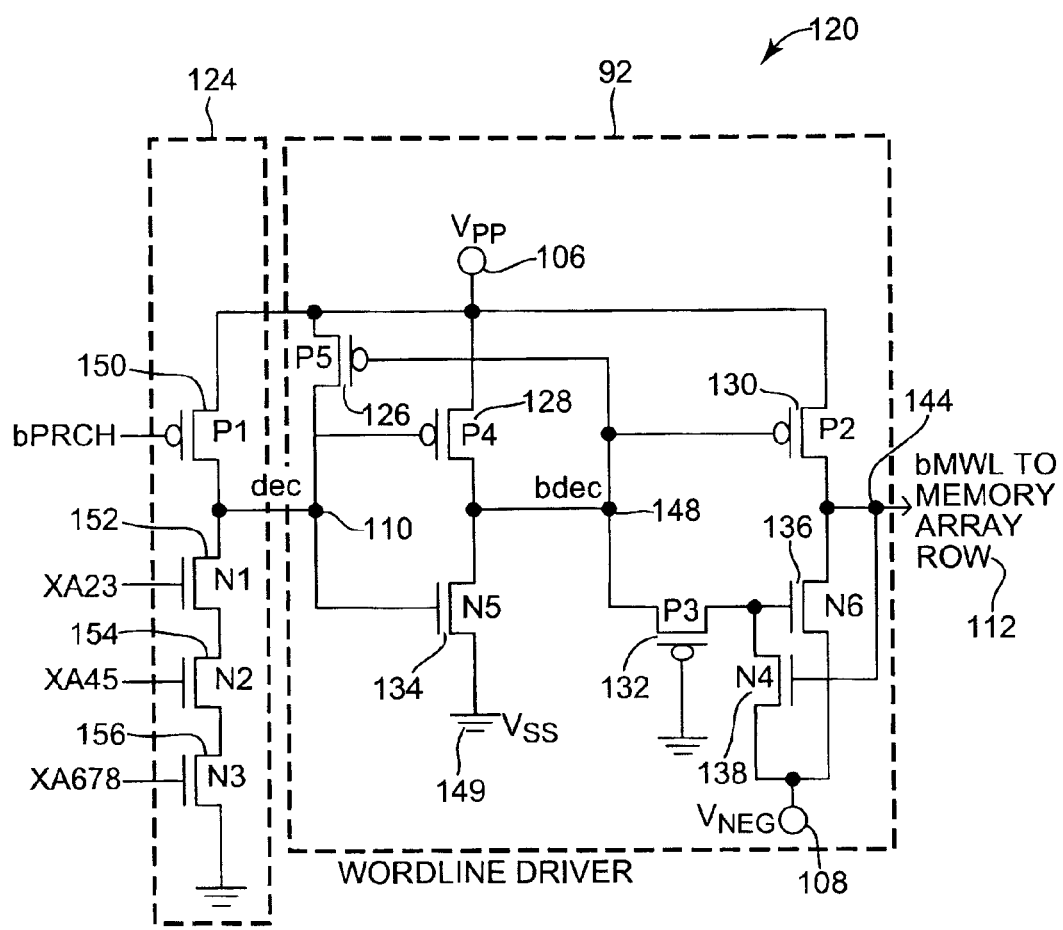
FIG. 4 is a schematic block diagram illustrating one exemplary embodiment of a row decoder according to the present invention.

FIG. 4 is a schematic block diagram illustrating one exemplary embodiment of a row decoder 120 for use in a semiconductor memory device, such as a DRAM device, employing wordline circuit 92 according to the present invention. As illustrated, row decoder 120 further includes a decoding unit 124. In the illustrated embodiment, wordline circuit 92 further includes PMOS transistors 126, 128, 130, and 132, NMOS transistors 134, 136, and 138, an output node 144, and a bar decode node (bdec) 148.

Wordline circuit 92 receives positive voltage ($V_{PP}$) at positive voltage node 106 from an external power source, such as positive voltage charge pump 94, and a negative voltage ($V_{NEG}$) at negative voltage node 108 from an external power source, such as a negative voltage charge pump 96. Wordline circuit 92 provides wordline signal 112 at output node 144 to drive a corresponding row of an associated memory array "open" or "closed" in response to a decoding signal received from decoding unit 124 at dec node 110. In one embodiment, wordline signal 112 is a bar wordline signal (bMWL). When the associated DRAM device is in a self-resfresh mode (sometimes also referred to as an idle, or standby mode), wordline driver 92 is configured to form a leakage path from positive voltage node 106 to a reference node 149 at a reference voltage level ($V_{SS}$). In the illustrated embodiment, reference node 149 and $V_{SS}$ comprises a ground reference.

PMOS transistor 126 has source coupled to positive voltage node 106, a drain coupled to dec node 110, and a gate coupled to bdec node 148. PMOS transistor 128 has a source coupled to positive voltage node 106, a drain coupled to bdec node 148, and a gate coupled to node dec 110. NMOS transistor 134 has a gate coupled to dec node 110, a drain coupled to bdec node 148, and a source coupled to ground.

PMOS transistor 130 has a gate coupled to bdec node 148, a source coupled to positive voltage node 106, and a drain coupled to output node 144. PMOS transistor 132 has a gate coupled to ground, a source coupled to bdec node 148, and a drain. NMOS transistor 136 has a gate coupled to the drain of PMOS transistor 132, a drain coupled to output node 144, and a source coupled to negative voltage node 108. NMOS transistor 138 has a gate coupled to output node 144, a drain coupled to the gate of NMOS transistor 136, and a source coupled to negative voltage node 108. In one embodiment, transistors 128 and 130 form a translation block, transistors 130, 132, 136 and 138 form an output block, and transistor 126 operates as a latch.

Decoding unit 124 includes a PMOS transistor 150 and a cascade arrangement of NMOS transistors 152, 154, and 156. PMOS transistor 150 has a drain coupled to node dec 110, a gate receiving a bar precharge signal (bPRCH), and a source coupled to positive voltage node 106. NMOS transistor 152 has a drain coupled to node dec 110 and a source coupled to a drain of NMOS transistor 154. NMOS transistor 156 has a drain coupled to a source of NMOS transistor 154 and a drain coupled to ground. The gates of NMOS transistors 152, 154, and 156 respectively receive address signals XA23, XA45, and XA678, which represent address lines two through eight of a memory bus of an associated semiconductor memory device, such as a DRAM device, in precoded form.

During an access operation of a corresponding row(s) of the associated memory array, bPRCH and address inputs XA23, XA45, and XA678 are all set "high". As a result, PMOS transistor 150 is turned off and NMOS transistors 152, 154, and 156 are turned on, thereby setting a decoding signal at node dec 110 to "low" by pulling node dec 110 to ground. With node dec 110 at ground, NMOS transistor 134 is turned off and PMOS transistor 128 is turned on, causing bdec node 148 to be set to $V_{PP}$.

With bdec node 148 at $V_{PP}$, PMOS transistors 126 and 130 are turned off and PMOS transistor 132 is turned on. With PMOS transistor 132 turned on, the gate of NMOS transistor 136 is set to $V_{PP}$, causing NMOS transistor 136 to turn on. With NMOS transistor 136 turned on, output node 144, and thus wordline signal bMWL 112, are set to $V_{NEG}$ causing the corresponding row of the associated memory array to be "opened" for an access operation, such as a read/write operation.

During standby, or self-refresh mode, except during a refresh operation, bPRCH is held "low". With bPRCH held "low", PMOS transistor 150 is turned on, thereby setting the decoding signal at node dec 110 to "high" by pulling node dec 110 to $V_{PP}$ at positive voltage terminal 106. With node dec 110 at $V_{PP}$, PMOS transistor 128 is turned off and NMOS transistor 134 is turned on causing bdec node 148 to be set to ground.

With bdec node 148 at ground, PMOS transistors 126 and 130 are turned on. PMOS transistor 126 functions as a latch to hold node dec 110 at $V_{PP}$ during self-refresh mode when bPRCH is set "high" but the corresponding memory array row is not selected for refresh via address inputs XA23, XA45, and XA678.

With PMOS transistor 132 transferring the $V_{SS}$ level (as illustrated, the ground reference) to the gate of NMOS transistor 136, NMOS transistor 136 is turned off. With PMOS transistor 130 turned on, output node 144 is set to $V_{PP}$, causing NMOS transistor 138 to turn on and set the gate of NMOS transistor is set to $V_{NEG}$ to thereby ensure isolation between positive voltage node 106 and negative voltage node 108. Additionally, with output node 144 at $V_{PP}$, wordline signal bMWL 112 is also set to $V_{PP}$ causing the corresponding row of the associated memory array to be "closed."

During standby, or self-refresh mode, wordline driver 122 forms a current leakage path from positive voltage node 106 to ground via PMOS transistor 128 and NMOS transistor 134. Thus, wordline driver 122 according to the present invention eliminates the leakage path to negative voltage terminal 108 existing in conventional wordline drivers. Therefore, when voltages $V_{PP}$ and $V_{NEG}$ are provided to positive and negative voltage nodes 106 and 108 by positive and negative charge pumps, respectively, leakage current ($I_{LEAK}$) flows from the positive voltage pump to ground rather than to the negative charge pump. As a result, only the $V_{PP}$ voltage level provided by the positive charge pump is affected by the $I_{LEAK}$. Thus, only the positive charge pump consumes power to maintain its output voltage at $V_{PP}$, resulting in less power consumption during standby operation of the associated semiconductor memory device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory comprising:
   an array of memory cells arranged in a plurality of rows and columns wherein access of each row is based on a wordline signal; and
   a wordline circuit receiving a positive voltage at a positive voltage node, a negative voltage at a negative voltage node, and a decoding signal representative of an idle mode at a decoding node, and providing a wordline signal to at least one of the rows of memory cells based on the decoding signal, the wordline circuit configured to form a leakage path from the positive voltage node to a reference node when the decoding signal indicates the idle mode.

2. The memory of claim 1, wherein the memory cells comprises DRAM memory cells.

3. The memory of claim 1, wherein the reference node is a ground reference.

4. The memory of claim 1, wherein the wordline circuit further comprises:
   a latch configured to hold a state of the decoding node;
   a translation block configured to provide a voltage level at a bar decode node based on the decoding signal; and
   an output block configured to provide the wordline signal at an output node based on the voltage level.

5. The memory of claim 4, wherein the latch comprises a PMOS transistor having a gate coupled to the bar decode node, a source coupled to the positive voltage node, and a drain coupled to the decoding node.

6. The memory of claim 4, wherein the translation block further comprises:
   a PMOS transistor having a gate coupled to the decoding node, a source coupled to the positive voltage node, and a drain coupled to the bar decode node; and
   an NMOS transistor having a gate coupled to the decoding node, a drain coupled to the bar decode node, and a source coupled to the reference node.

7. The memory of claim 6, wherein the leakage path comprises a path from the positive voltage node to the reference node via the PMOS transistor and the NMOS transistor of the translation block.

8. A random access memory comprising:
   an array of memory cells arranged in a plurality of rows and columns wherein access of each row is based on a wordline signal; and
   a wordline circuit receiving a positive voltage at a voltage node, receiving a decoding signal representative of an idle mode at a decoding node, and providing to at least one of the rows of memory cells a wordline signal based on the decoding signal and forming a leakage path from the voltage node to a reference node when the decoding signal indicates the idle mode, the wordline circuit comprising:
   a latch configured to hold a state of the decoding node;
   a translation block configured to provide a voltage level at a bar decode node based on the decoding signal; and
   an output block configured to provide the wordline signal at an output node based on the voltage level, the output block comprising:
     a first PMOS transistor having a gate coupled to the bar decode node, a source coupled to the voltage node, and a drain coupled to the output node;
     a second PMOS transistor having a gate coupled to the reference node, a source coupled to the bar decode node, and a drain;
     a first NMOS transistor having a gate coupled to the output node, a drain coupled to the drain of the second PMOS transistor, and a source coupled to a negative voltage node receiving a negative voltage from an external power source; and
     a second NMOS transistor having a gate coupled to the drain of the second PMOS transistor, a drain coupled to the output node, and a source coupled to the negative voltage node.

9. A wordline circuit use in a random access memory (RAM), the wordline circuit receiving a positive voltage at a positive voltage node, a negative voltage at a negative voltage node, and a decoding signal representative of a self-refresh mode at a decoding node, and providing a wordline signal based on the decoding signal and forming a current leakage path from the positive voltage node to a reference node when the decoding signal indicates the self-refresh mode.

10. The wordline circuit of claim 9, wherein the reference node comprises a ground node.

11. The wordline circuit of claim 9 further comprising:
a latch configured to hold a state of the decoding node;
a translation block configured to provide a voltage level at a bar decode node based on the decoding signal; and
an output block configured to provide the wordline signal at an output node based on the voltage level.

12. The wordline circuit of claim 11, wherein the latch comprises a PMOS transistor having a gate coupled to the bar decode node, a source coupled to the positive voltage node, and a drain coupled to the decoding node.

13. The wordline circuit of claim 11, wherein the translation block further comprises:
a PMOS transistor having a gate coupled to the decoding node, a source coupled to the positive voltage node, and a drain coupled to the bar decode node; and
an NMOS transistor having a gate coupled to the decoding node, a drain coupled to the bar decode node, and a source coupled to the reference node.

14. The wordline circuit of claim 13, wherein the leakage path comprises a path from the positive voltage node to the reference node via the PMOS transistor and the NMOS transistor of the translation block.

15. A wordline circuit suitable for use in a random access memory (RAM), the wordline circuit receiving a positive voltage at a voltage node, receiving a decoding signal representative of a self-refresh mode at a decoding node, and providing a wordline signal based on the decoding signal and forming a current leakage path from the voltage node to a reference node when the decoding signal indicates the self-refresh mode, the wordline circuit comprising:
a latch configured to hold a state of the decoding node;
a translation block configured to provide a voltage level at a bar decode node based on the decoding signal; and
an output block configured to provide the wordline signal at an output node based on the voltage level, the output block comprising:
a first PMOS transistor having a gate coupled to the bar decode node, a source coupled to the voltage node, and a drain coupled to the output node;
a second PMOS transistor having a gate coupled to the reference node, a source coupled to the bar decode node, and a drain;
a first NMOS transistor having a gate coupled to the output node, a drain coupled to the drain of the second PMOS transistor, and a source coupled to a negative voltage node receiving a negative voltage from an external power source; and
a second NMOS transistor having a gate coupled to the drain of the second PMOS transistor, a drain coupled to the output node, and a source coupled to the negative voltage node.

16. A row decoder for use in a random access memory comprising:
a decoder unit decoding an externally inputted precharge signal and externally inputted row address signals, and providing a decoding signal representative of an idle state; and
a wordline circuit receiving a positive voltage at a positive voltage node, a negative voltage at a negative voltage node, and the decoding signal at a decode node, and providing a wordline signal based on the decoding signal, and forming a current leakage path from the positive voltage node to a reference node when the decoding signal indicates the idle state.

17. The row decoder of claim 16, wherein the decoder unit further comprises:
a PMOS transistor receiving the precharge signal at a gate, having a source coupled to the positive voltage node, and a drain coupled to the decode node;
a first NMOS transistor receiving a first address signal at a gate, having a drain coupled to the decode node, and a source;
a second NMOS transistor receiving a second address signal at a gate, having a drain coupled to the source of the first NMOS transistor, and a source; and
a third NMOS transistor receiving a third address signal at a gate, having a drain coupled to the source of the second NMOS transistor, and a source coupled to a reference node.

18. The row decoder of claim 16, wherein the reference node is ground.

19. The row decoder of claim 16, wherein the wordline circuit further comprises:
a latch configured to hold a state of the decode node;
a translation block configured to provide a voltage level at a bar decode node based on the decoding signal; and
an output block configured to provide the wordline driver signal at an output node based on the voltage level.

20. The row decoder of claim 19, wherein the latch comprises a PMOS transistor having a gate coupled to the bar decode node, a source coupled to the positive voltage node, and a drain coupled to the decode node.

21. The row decoder of claim 19, wherein the translation block further comprises:
a PMOS transistor having a gate coupled to the decode node, a source coupled to the positive voltage node, and a drain coupled to the bar decode node; and
an NMOS transistor having a gate coupled to the decode node, a drain coupled to the bar decode node, and a source coupled to the reference node.

22. The row decoder of claim 21, wherein the leakage path comprises a path from the positive voltage node to the reference node via the PMOS transistor and the NMOS transistor of the translation block.

23. A row decoder for use in a random access memory comprising:
a decoder unit decoding an externally inputted precharge signal and externally inputted row address signals, and providing a decoding signal representative of an idle state; and
a wordline circuit receiving a positive voltage at a voltage node, receiving the decoding signal at a decode node, providing a wordline signal based on the decoding signal, and forming a current leakage path from the voltage node to a reference node when the decoding signal indicates the idle state, the wordline circuit comprising:
a latch configured to hold a state of the decode node;
a translation block configured to provide a voltage level at a bar decode node based on the decoding signal; and
an output block configured to provide the wordline driver signal at an output node based on the voltage level, the output block comprising:

a first PMOS transistor having a gate coupled to the bar decode node, a source coupled to the voltage node, and a drain coupled to the output node;

a second PMOS transistor having a gate coupled to the reference node, a source coupled to the bar decode node, and a drain;

a first NMOS transistor having a gate coupled to the output node, a drain coupled to the drain of the second PMOS transistor, and a source coupled to a negative voltage node receiving a negative voltage from an external power source; and a second NMOS transistor having a gate coupled to the drain of the second PMOS transistor, a drain coupled to the output node, and a source coupled to the negative voltage node.

24. A method of reducing leakage current of a driver circuit during an idle mode of a random access memory, the method comprising:

receiving a decoding signal representative the idle mode;

receiving a positive voltage from an external power source at a positive voltage node;

receiving a negative voltage from an external power source at a negative voltage node; and forming a leakage path from the positive voltage node to a reference node when the decoding signal indicates the idle mode.

25. The method of claim 24, wherein the reference node is ground.

26. A method of reducing losses in a random access memory (RAM) having a driver circuit receiving a positive voltage from a positive voltage source and a negative voltage from a negative voltage source, the method comprising:

receiving a decoding signal having a state representative of an idle mode; and forming a current leakage path from the positive voltage source to a reference node when the state of the decoding signal represents the idle mode.

27. The method of claim 26, wherein the reference node is ground.

28. A random access memory comprising:

an array of memory cells arranged in a plurality of rows and columns, wherein access of each row is based on a wordline signal; and a wordline circuit receiving a positive voltage at a positive voltage node, a negative voltage at a negative voltage node, and a decoding signal, the wordline circuit configured to couple the negative voltage node to an output node so as to provide a wordline signal substantially at the negative voltage when the decoding signal indicates an access operation, and when the decoding signal indicates an idle mode, configured to couple the positive voltage node to the output node so as to provide the wordline signal substantially at the positive voltage, to isolate the positive voltage node from the negative voltage node, and to form a leakage path from the positive voltage node to a reference node.

* * * * *

UNITED STATES PATENT AND TRADEMARK OFFICE
CERTIFICATE OF CORRECTION

PATENT NO. : 6,909,660 B2
DATED : June 21, 2005
INVENTOR(S) : Oh

It is certified that error appears in the above-identified patent and that said Letters Patent is hereby corrected as shown below:

Title page,
Item [73], Assignee, "Infineon Technologies North America Corp., San Jose, CA (US)" has been changed to -- Infineon Technologies AG, Munich, Fed Rep Germany --.

Column 3,
Line 45, "10" has been changed to -- 110 --.

Signed and Sealed this

Eleventh Day of October, 2005

JON W. DUDAS
*Director of the United States Patent and Trademark Office*